United States Patent [19]

Hata et al.

[11] Patent Number: 5,064,631

[45] Date of Patent: * Nov. 12, 1991

[54] PROCESS FOR PREPARATION OF ALUMINUM BORATE WHISKER

[75] Inventors: Hajime Hata; Hajime Kambara; Seiji Sogabe; Keizo Oka, all of Marugame, Japan

[73] Assignee: Shikoku Chemicals Corporation, Kagawa, Japan

[*] Notice: The portion of the term of this patent subsequent to Oct. 29, 2008 has been disclaimed.

[21] Appl. No.: 452,504

[22] Filed: Dec. 19, 1989

[30] Foreign Application Priority Data

Dec. 19, 1988 [JP]  Japan ................................ 63-320873

[51] Int. Cl.$^5$ ........................ C01B 35/12; C03C 3/145
[52] U.S. Cl. ............................ 423/279; 156/DIG. 61; 156/DIG. 112; 423/277; 501/95
[58] Field of Search ................... 501/52, 127, 153, 95; 156/DIG. 112, DIG. 61; 423/277, 279; 264/56

[56] References Cited

U.S. PATENT DOCUMENTS 3,080,242  3/1963  Berry ........................................ 501/95
3,350,166  10/1967  Alley et al. ............................ 156/614
4,774,210  9/1988  Ray ........................................ 501/127
4,789,422  12/1988  Misra ................................ 156/DIG. 61

FOREIGN PATENT DOCUMENTS 0296779  12/1988  European Pat. Off. ............ 423/279

OTHER PUBLICATIONS

Bailar et al. *Comprehensive Inorganic Chemistry*, 1973, pp. 1055–1057.

*Primary Examiner*—Michael L. Lewis
*Assistant Examiner*—Stephen G. Kalinchak
*Attorney, Agent, or Firm*—Sherman and Shalloway

[57] ABSTRACT

A mixture comprising (i) an oxide, hydroxide or oxyhydroxide of aluminum, (ii) an aluminum-containing sulfate, (iii) an oxide or oxyacid of boron or an alkali metal salt thereof and (iv) an alkali metal sulfate is heated at a temperature of 900 to 1200° C. to grow an aluminum borate whisker. In this process, the reaction is advanced apparently in the solid phase, and this process is advantageous over the conventional processes in that the yield is high and the isolation and purification of the reaction product is facilitated.

1 Claim, No Drawings

PROCESS FOR PREPARATION OF ALUMINUM BORATE WHISKER

BACKGROUND OF THE INVENTION

The present invention relates to a process for the preparation of an aluminum borate whisker.

The aluminum borate whisker prepared according to the process of the present invention is excellent in mechanical strength, heat resistance, heat-insulating property, chemical resistance, electrical insulating property and neutron-absorbing property, and this whisker is valuable as a reinforcer for a thermoplastic resin, theremosetting resin, cement, glass or metal.

DESCRIPTION OF THE PRIOR ART

Various processes have been tried for aluminum borate whiskers excellent in mechanical strength, chemical resistance and other properties, and these processes are roughly divided into the gas phase method and the liquid phase method. The specification of U.S. Pat. No. 3,350,166 describes that by passing water vapor through gaseous aluminum fluoride and boron oxide at a temperature of 1000° to 1400° C., a whisker having a composition of $4Al_2O_3.B_2O_3$ is obtained.

As the liquid phase method, the specification of U.S. Pat. No. 3,080,242 describes that by heating a mixture of aluminum hydroxide and boron oxide, a whisker having a composition of $3Al_2O_3.B_2O_3$ or $9Al_2O_3.B_2O_3$ is obtained. In this method, excessive boron oxide acts as the flux. Furthermore, from the report of Bureau of Mines, U.S.A., it is known that a whisker having a composition of $2.5Al_2O_3.B_2O_3$ is obtained by heating a mixture of aluminum oxide, sodium tetraborate and lithium chloride at 1200° C. and that a whisker having a composition of $4.8Al_2O_3.B_2O_3$ is obtained by heating a mixture of aluminum oxide, sodium tetraborate and boron oxide at 1400° C. [Bureau of Mines Report of Investigations, 6575 (1965)]. Also in these methods, the excessive sodium tetraborate/lithium chloride mixture or the excessive sodium tetraborate/boron oxide mixture acts as the flux, and in general, the boric acid component is incorporated in an amount of at least three equivalents and the excessive portion acts as the flux.

Non-whisker aluminum borate can be obtained by pulverizing and mixing an aluminum source component and a boric anhyride source component and heating the mixture at a temperature of 700° to 1200° C. Since the aluminum source component is solid in the above-mentioned temperature range, the reaction becomes heterogeneous, and the aluminum source component exists in the reaction products. In order to grow a whisker in this reaction system, it is necessary to make the reaction mixture as homogeneous as possible and maintain a physical space for the growth of the whisker. For this purpose, boron oxide and an alkali metal borate are incorporated as a flux into the reaction mixture.

However, since the boron oxide and alkali metal borate have a high melt viscosity, the growing rate of the whisker is very low. Accordingly, the viscosity of the reaction mixture should be reduced by incorporating an alkali metal chloride or the like. According to this method, a large whisker of aluminum borate can be obtained, but the excessive boric anydride source component tends to form a multi-component glass matrix together with the aluminum source component and the alkali component and the grown whisker is wrapped with this glass matrix. Therefore, the operation of eluting the glass matrix component becomes necessary and hence, a long time is required for isolation of the whisker. Furthermore, the method is defective in that since a part of the aluminum source component is used as the component of the glass matrix, the yield of the aluminum borate whisker is reduced.

Moreover, in the above-mentioned system, since the whole reaction mixture is completely melted, a reaction vessel having a shape of a crucible is necessary. If a platinum crusible stable to the molten salts is used, although the content can be easily withdrawn after cooling, the cost increases and the process is not suitable for the industrial production.

If a cheap ceramic crucible formed of alumina, mullite or silica is used, the boron oxide component contained in the molten salt reacts very easily with the material of the crucible and the content is completely fusion-bonded to the crucible. Accordingly, for the isolation of the whisker, it is necessary that the crucible with the content should be immersed in hydrochloric acid, followed by boiling. In this case, the crucible having the inner surface already deteriorated by the contact with the molten salts is further damaged, and it is impossible to use the crucible repeatedly.

SUMMARY OF THE INVENTION

It is a primary object of the present invention to provide a process for the prepartion of an aluminum borate whisker, which is capable of providing an aluminum borate whisker in a high yield without using an expensive reaction vessel, isolation and purification of the reaction product being facilitated without wearing of the vessel, and which is therefore suitable for the production of a whisker on an industrial scale.

We made research and investigation under the above-mentioned background, and as the result, it was found that this object can be attained by using a mixture of at least one compound selected from the group consisting of oxides, hydroxides and oxyhydroxides of aluminum as a first aluminum source component and at least one member selected from the group consisting of aluminum-containing sulfates as the second aluminum source component. We have now completed the present invention based on this finding.

More specifically, in accordance with the process of the present invention, by mixing at least one compound selected from the group consisting of oxides, hydroxides and oxyhydroxides of aluminum as the first aluminum source component and at least one compound selected from the group consisting of aluminum-containing sulfates as the second aluminum source component with at least one boric anhydride source component selected from the group consisting of oxides, oxyacids and alkali metal salts of boron and at least one flux component selected from the group consisting of alkali metal sulfates, and heating the mixture at a temperature of 900° to 1200° C. to effect the growth, an aluminum borate whisker can be grown in the state where macroscopically, the entire system is not molten but apparently kept in the solid phase though the flux is microscopically melted.

In the process of the present invention, it is indispensable that a small amount of an aluminum-containing sulfate should be present in the starting material mixture, and if this aluminum-containing sulfate is co-present with the flux, a whisker grows large.

DETAILED DESCRIPTION OF THE PREFERRED EMBODIMENT

Aluminum compounds such as α-type aluminum oxide, γ-type aluminum oxide, aluminum hydroxide, boehmite and diaspore can be used as the first aluminum source component.

As the second aluminum source component, there can be mentioned aluminum sulfate, sodium aluminum alum, potassium aluminum alum, trisodium aluminum trisulfate, tripotassium aluminum trisulfate and hydrates thereof. All of these sulfates undergo desulfurizing reaction at temperatures higher than 900° C. and are converted to aluminum oxide. Accordingly, these sulfates act as the aluminum source component.

As the boric anhydride source component, there can be mentioned boron oxide, boric acid, pyroboric acid, metaboric acid, sodium tetraborate, potassium tetraborate, sodium metaborate and boron alkoxides such as $B(OC_2H_5)$.

Sodium sulfate, potassium sulfate and hydrate thereof can be mentioned as the flux.

Each of the foregoing components can be used in the form of a mixture of the recited compounds.

In carrying out the process of the present invention, the first and second aluminum source components, the boric anhydride source component and the flux component are mixed so that the proportion of the aluminum-containing sulfate as the second aluminum source component in the total aluminum source component is 3 to 40 mole % as aluminum, the molar ratio of aluminum in the total aluminum source component to boron in the boric anhydride source component is from 6/4 to 9/2 and the molar ratio of aluminum in the total aluminum source component to the alkali metal in the flux component is from 1/1 to 1/10, and the starting material mixture powder is charged in an alumina crucible. The temperature is elevated at a rate of 2° to 50° C. per minute, and finally, the starting material mixture is maintained at a temperature of 900° to 1200° C. for 30 minutes to 8 hours, whereby an aluminum borate whisker having a composition represented by the formula of $9Al_2O_3.B_2O_3$ can be grown. In this case, if the starting material mixture is tabulated or molded by adding water or an organic solvent and a binder and a molded bulk is placed on a ceramic plate and reacted under the same temperature condition, a whisker can be grown without using any reaction vessel.

In connection with the mixing ratio of the starting materials, if the proportion of the second aluminum source component in the total aluminum source component is lower than 3 mole % as aluminum or higher than 40 mole % as aluminum, a whisker is not grown large or there is a fear of melting of the entire reaction mixture.

If the proportion of boron increases and the total aluminum/boron molar ratio is lower than 6/4 or if the proportion of the alkali metal sulfate increases and the total aluminum/alkali metal molar ratio is lower than 1/10, the entire reaction mixture is melted and it is impossible to grow a whisker without using a reaction vessel.

If the proportion of total aluminum increases and the total aluminum/boron molar ratio exceeds 9/2, α-type aluminum oxide is formed as a by-product and it is difficult to separate this α-type aluminum oxide from an aluminum borate whisker having a composition represented by the formula of $9Al_2O_3.2B_2O_3$.

For isolation of the aluminum borate whisker from the reaction product containing the flux, the flux and other water-soluble substances are removed by using hot hydrochloric acid, hot sulfuric acid, hot nitric acid or hot caustic soda having a concentration of about 1N or hot water, and the residue is sufficiently washed with water. When water-insoluble by-products are contained, the whisker is separated from the above-mentioned residue by decantation or the like and the recovered whisker is sufficiently washed with water.

In general, the so-obtained aluminum borate whisker has a thickness of 0.1 to 5 μm and a length of 2 to 200 μm.

In the process of the present invention, by using a small amount of an aluminum sulfate type compound as a second aluminum source component and an alkali metal sulfate as the flux, there can be obtained a whisker larger than the whisker obtained by the reaction of an aluminum sulfate type compound-free starting material mixture, for example, a mixture comprising aluminum hydroxide, boric acid and potassium sulfate. The reason is considered to be that aluminum sulfate reacts with the alkali metal sulfate present in the reaction mixture at a temperature of about 600° to about 700° C. to form a trialkali metal aluminum trisulfate [$M_3Al(SO_4)_3$; M represents an alkali metal]. This trisulfate is melted at about 700° C. and is present stably at a temperature of up to 1000° C. where the whisker begins to grow, and this trisulfate, therefore, acts as a good flux for the other aluminum source component present in the reaction mixture and exerts a synergistic effect with the alkali metal sulfate contained as the other flux.

The present invention will now be described in detail with reference to the following examples and comparative examples that by no means limit the scope of the invention.

In the examples and comparative examples, the mole numbers of the starting materials are mole numbers of the metals contained in the starting materials, that is, aluminum, boron and the alkali metal.

EXAMPLES 1 THROUGH 8

A mixture comprising first aluminum source component, the second aluminum source component, a boric anhydride source component and a flux component at a mixing ratio shown in Table 1 or 2 was pulverized and blended in a mortar, and the pulverized mixture was charged in a stainless steel mold having an inner diameter of 37 mm and compression-molded under a pressure of 100 Kg/cm². The molded body was placed on an alumina plate and in an electric furnace, the temperature was elevated at a rate of 5° C. per minute and reaction was carried out at a temperature of 1100° C. The cooled reaction product was not deformed at all and was not bonded to the alumina plate at all. About 200 ml of 1N hydrochloric acid was added to the reaction product and boiling was carried out for about 8 hours to remove the flux component and unreacted component by the dissolution. The residue was washed with water and dried to obtain a whisker having a composition represented by the formula of $9Al_2O_3.2B_2O_3$. The shape of the obtained whisker, the amount obtained of the whisker and the yield of the whisker are shown in Tables 1 and 2.

TABLE 1

|  | Example 1 | Example 2 | Example 3 | Example 4 |
|---|---|---|---|---|
| α-$Al_2O_3$ | 2.80 g | | | |

TABLE 1-continued

|  | Example 1 | Example 2 | Example 3 | Example 4 |
|---|---|---|---|---|
| $\gamma$-$Al_2O_3$ | 0.055 mole | | | |
| $Al(OH)_3$ | | 2.80 g<br>0.055 mole | | |
| | | | 5.69 g<br>0.073 mole | |
| $AlO(OH)$ | | | | 4.80 g<br>0.08 mole |
| $Al_2(SO_4)_3$ | 0.86 g<br>0.005 mole | 1.71 g<br>0.01 mole | 1.20 g<br>0.007 mole | 1.71 g<br>0.01 mole |
| $H_3BO_3$ | 2.47 g<br>0.04 mole | 1.85 g<br>0.03 mole | 1.24 g<br>0.02 mole | 1.24 g<br>0.02 mole |
| $Na_2SO_4$ | 7.10 g<br>0.10 mole | | | 10.65 g<br>0.15 mole |
| $K_2SO_4$ | | 8.71 g<br>0.10 mole | 17.43 g<br>0.20 mole | 13.07 g<br>0.15 mole |
| Shape of Whisker | | | | |
| thickness | 2.0 μm | 1.0 μm | 1.0 μm | 0.6 μm |
| length | 50 μm | 10 μm | 25 μm | 10 μm |
| Amount Obtained of Whisker | 2.82 g | 3.70 g | 4.37 g | 5.02 g |
| Yield of Whisker | 80% | 90% | 93% | 95% |

TABLE 2

|  | Example 5 | Example 6 | Example 7 | Example 8 |
|---|---|---|---|---|
| $Al(OH)_3$ | 5.46 g<br>0.07 mole | 5.46 g<br>0.07 mole | 5.46 g<br>0.07 mole | 5.46 g<br>0.07 mole |
| $Al_2(SO_4)_3$ | 1.71 g<br>0.01 mole | | | |
| $Al_2(SO_4)_3$ · 13.4$H_2O$ | | 2.92 g<br>0.01 mole | | |
| $NaAl(SO_4)_2$ | | | 2.42 g<br>0.01 mole | |
| $K_3Al(SO_4)_3$ | | | | 4.32 g<br>0.01 mole |
| $H_3BO_3$ | 1.24 g<br>0.02 mole | 1.24 g<br>0.02 mole | | |
| $B_2O_3$ | | | 0.70 g<br>0.02 mole | |
| $Na_2B_4O_7$ | | | | 0.70 g<br>0.02 mole |
| $K_2SO_4$ | 8.72 g<br>0.10 mole | 34.86 g<br>0.40 mole | 17.43 g<br>0.20 mole | 17.43 g<br>0.20 mole |
| Shape of Whisker | | | | |
| thickness | 2.0 μm | 1.0 μm | 1.0 μm | 2.0 μm |
| length | 50 μm | 50 μm | 30 μm | 40 μm |
| Amount Obtained of Whisker | 4.46 g | 4.23 g | 4.37 g | 4.28 g |
| Yield of Whisker | 95% | 90% | 93% | 91% |

EXAMPLE 9

To 20 l of water were added 280.8 g (3.6 moles) of aluminum hydroxide, 116.6 g (0.4 mole) of aluminum sulfate 13.4-hydrate, 61.83 g (1.0 mole) of boric acid and 871.3 g (3.0 moles) of potassium sulfate, and the mixture was heated at 70° to 80° C. to prepare a slurry in which all the components other than aluminum hydroxide were completely dissolved. The slurry was formed into granules where the starting materials were homogeneously mixed, by the spray-drying method. A part of the granulated mixture was charged in a stainless steel mold having an inner diameter of 90 mm and tabulated under a total pressure of about 20 tons. The height of the tablet was about 55 mm and the weight was 620 g. The tablet was placed on an alumina plate having a diameter of 100 mm and a thickness of 5 mm. In an electric furnace, the temperature was elevated at a rate of 10° C. per minute and reaction was carried out at a temperature of 1150° C. The cooled reaction product retained the shape of the tablet, and the reaction product did not stick to the alumina plate and could be easily taken out. The obtained reaction product was immersed in about 2 l of water and boiling was carried out for about 8 hours to remove the flux by the dissolution. Then, about 500 ml of 1 N hydrochloric acid was added to the recovered solid and boiling was carried out for about 1 hour to remove the unreacted component by the dissolution. The residue was washed with water and dried to obtain a whisker having a composition represented by the formula of $9Al_2O_3 \cdot 2B_2O_3$. The amount obtained of the whisker was 98 g, and the yield was 90%. The whisker had a thickness of 1 to 2 μm and a length of 20 to 40 μm.

EXAMPLE 10

To a mixture comprising 280.8 g (3.6 moles) of aluminum hydroxide, 68.44 g (0.4 mole) of aluminum sulfate, 61.83 g (1.0 mole) of boric acid and 871.3 g (3.0 moles) of potassium sulfate was added to 200 ml of water, and the obtained clay-like mixture was uniformalized by using a three-roll mill. The mixture was stuffed into a wood mold having a side of 150 mm and beaten by a wood hammer to pack the mixture into the wood mold. The mixture was dried by standing at room temperature for 12 hours. Then, the wood frame was taken out and the content was placed on a brick of mullite and treated in the same manner as described in Example 9 to obtain a whisker having the same size as that of the whisker obtained in Example 9. The amount obtained of the whisker was 218 g, and the yield was 93%.

COMPARATIVE EXAMPLE 1

A mixture comprising 3.12 g (0.08 mole) of aluminum hydroxide, 3.02 g (0.06 mole) of sodium tetraborate and 5.84 g of sodium chloride was pulverized and blended in a mortar, and the obtained starting mixture was charged in an alumina crucible. In an electric furnace, the temperature was elevated at a rate of 5° C. per minute and reaction was carried out at 1100° C. for 4 hours. In the cooled reaction product, there was a trace indicating that the reaction mixture was completely melted, and the reaction product was a glassy product stuck tightly to the crucible. Accordingly, the reaction product could not be taken out. For isolating the whisker, the crucible with the reaction product stuck thereto was immersed in 200 ml of 1N hydrochloric acid and the boiling treatment was carried out to remove the flux and unreacted component by the dissolution. Since the boron component formed a glass with other components, only the top surface of the content in the crucible was sufficiently contacted with hydrochloric acid, and therefore, such a long time as 50 hours was necessary for completion of this treatment. The recovered product was washed with water and dried to obtain a whisker having such a large size as a thickness of 1 to 3 μm and a length of 20 to 60 μm. The amount obtained of the whisker was 0.7 g and the yield was only 31%.

The inner surface of the used alumina crucible was corroded in the vicinity of the liquid level, and a weight loss of about 1% was observed. When potassium chloride, sodium sulfate or potassium sulfate was used instead of sodium chloride, similar results were obtained.

As is apparent from the foregoing description, the process of the present invention is advantageous over the conventional processes in that an aluminum borate whisker can be prepared in a high yield on an industrial scale without using any particular reaction vessel.

We claim:

1. A method for preparing a $9Al_2O_3 \cdot 2B_2O_3$ whisker comprising the steps of
   (I) forming a raw materials mixture by mixing and pulverizing
   - (a) a first aluminum source component selected from the group consisting of aluminum oxide, aluminum hydroxide, aluminum oxyhydroxide, and mixtures thereof,
   - (b) a second aluminum source component selected from the group consisting of aluminum sulfate, trisodium aluminum trisulfate, tripotassium aluminum trisulfate, hydrates thereof, and mixture thereof,
   - (c) a boric anhydride supply component comprising at least one compound selected from the group consisting of boron oxides, oxyacids of boron, and alkali metal salts thereof.
   - (d) a fluxing agent selected from the group consisting of sodium sulfate, potassium sulfate, and mixtures thereof, wherein the amounts of (a), (b), (c) and (d) are such that, when added to the following step (II)
   the proportion of (b) in (a)+(b) is 3 to 40 mole % as aluminum, the molar ratio of aluminum in (a)+(b) to boron in (c) is from 6:4 to 9:2, and the molar ratio of aluminum in (a)+(b) to the alkali metal in (d) is from 1:1 to 1:10,
   (II) pressure molding the mixture of step (I) into a tablet, and
   (III) heating the tablet at a temperature of from 900° C. to 1200° C. to thereby convert the raw materials into aluminum borate whisker without substantially changing the shape of the tablet.

* * * * *